(12) United States Patent
Marr et al.

(10) Patent No.: US 6,515,931 B2
(45) Date of Patent: Feb. 4, 2003

(54) METHOD OF ANTI-FUSE REPAIR

(75) Inventors: Kenneth W. Marr, Boise, ID (US); Shubneesh Batra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/845,794

(22) Filed: Apr. 30, 2001

(65) Prior Publication Data

US 2001/0026494 A1 Oct. 4, 2001

Related U.S. Application Data

(63) Continuation of application No. 09/560,498, filed on Apr. 27, 2000, now Pat. No. 6,233,194, which is a continuation of application No. 09/389,072, filed on Sep. 2, 1999, now abandoned, which is a continuation of application No. 09/030,130, filed on Feb. 25, 1998, now Pat. No. 5,978,248, which is a continuation of application No. 08/700,234, filed on Aug. 20, 1996, now Pat. No. 5,742,555.

(51) Int. Cl.$^7$ .............................................. H01L 29/00
(52) U.S. Cl. ................. 365/225.7; 257/530; 257/410; 438/600
(58) Field of Search ................... 365/225.7, 189.01; 257/410, 530; 438/600

(56) References Cited

U.S. PATENT DOCUMENTS

| 4,233,671 A | 11/1980 | Gerzberg et al. ........... 365/105 |
| 4,387,503 A | 6/1983 | Aswell et al. ................ 29/575 |
| 4,488,262 A | 12/1984 | Basire et al. ................ 365/104 |
| 4,569,120 A | 2/1986 | Stacy et al. .................... 29/574 |
| 4,748,490 A | 5/1988 | Hollingsworth .............. 357/51 |
| 4,751,197 A | 6/1988 | Wills ............................ 437/174 |
| 5,019,532 A | 5/1991 | Kaya ............................ 437/186 |
| 5,057,451 A | 10/1991 | McCollum .................... 437/69 |
| 5,087,589 A | 2/1992 | Chapman et al. ........... 437/195 |
| 5,087,958 A | 2/1992 | Chen et al. |
| 5,110,754 A | 5/1992 | Lowrey et al. ................ 437/52 |
| 5,130,777 A | 7/1992 | Galbraith et al. ............. 357/51 |
| 5,134,457 A | 7/1992 | Hamdy et al. ................ 357/51 |
| 5,148,391 A | 9/1992 | Zagar .......................... 365/96 |
| 5,166,901 A | 11/1992 | Shaw et al. ................. 365/105 |
| 5,200,652 A | 4/1993 | Lee ............................. 307/465 |
| 5,208,177 A | 5/1993 | Lee ............................... 437/47 |
| 5,231,050 A | 7/1993 | Boudou et al. ............. 437/173 |
| 5,233,206 A | 8/1993 | Lee et al. ....................... 257/50 |
| 5,241,496 A | 8/1993 | Lowrey et al. ............... 365/96 |
| 5,248,632 A | 9/1993 | Tung et al. .................. 437/195 |
| 5,250,459 A | 10/1993 | Lee ............................... 437/52 |
| 5,257,222 A | 10/1993 | Lee ............................... 365/96 |
| 5,257,225 A | 10/1993 | Lee ............................. 365/185 |
| 5,264,725 A | 11/1993 | Mullarkey et al. .......... 257/665 |
| 5,272,097 A | 12/1993 | Shiota .......................... 437/34 |
| 5,272,666 A | 12/1993 | Tsang et al. ................... 365/96 |

(List continued on next page.)

FOREIGN PATENT DOCUMENTS

| JP | 59105354 A | 6/1984 | ........... H01L/27/08 |
| JP | 61046045 | 3/1986 | ........... H01L/21/82 |

OTHER PUBLICATIONS

"Copy of PCT Search Report dated May 21, 1997, for International Application No. PCT/US 97/00167", 7 pages.

*Primary Examiner*—Viet Q. Nguyen
(74) *Attorney, Agent, or Firm*—Schwegman, Lundberg, Woessner & Kluth, P.A.

(57) ABSTRACT

An integrated circuit anti-fuse is described which is fabricated as a capacitor using a layer of oxide. The two plates of the anti-fuse are coupled to appropriate voltage levels to rupture the oxide and form a conductive short between the plates. One of the plates is formed as a diffused well which is coupled to an external voltage during programming. The well is biased to an internal voltage during normal operation of the circuit incorporating the anti-fuse.

32 Claims, 4 Drawing Sheets

U.S. PATENT DOCUMENTS

| | | | | |
|---|---|---|---|---|
| 5,276,653 | A | 1/1994 | McKenny | 365/225.7 |
| 5,281,553 | A | 1/1994 | Boudou et al. | 437/173 |
| 5,282,158 | A | 1/1994 | Lee | 365/96 |
| 5,299,150 | A | 3/1994 | Galbraith et al. | 365/94 |
| 5,299,152 | A | 3/1994 | Ishihara et al. | 365/96 |
| 5,301,159 | A | 4/1994 | Lee | 365/225.7 |
| 5,303,199 | A | 4/1994 | Ishihara et al. | 365/225.7 |
| 5,311,053 | A | 5/1994 | Law et al. | 257/529 |
| 5,315,177 | A | 5/1994 | Zagar et al. | 307/465 |
| 5,324,681 | A | 6/1994 | Lowrey et al. | 437/52 |
| 5,331,196 | A | 7/1994 | Lowrey et al. | 257/529 |
| 5,412,244 | A | 5/1995 | Hamdy et la. | 257/530 |
| 5,412,593 | A | 5/1995 | Magel et al. | 365/96 |
| 5,444,290 | A | 8/1995 | Paz De Araujo et al. | 257/530 |
| 5,448,187 | A | 9/1995 | Kowalski | 326/81 |
| 5,463,244 | A | 10/1995 | De Araujo et al. | 257/530 |
| 5,506,518 | A | 4/1996 | Chiang | 326/41 |
| 5,508,220 | A | 4/1996 | Eltoukhy et al. | 437/60 |
| 5,552,743 | A | 9/1996 | Manning | 327/567 |
| 5,742,555 | A * | 4/1998 | Marr et al. | 365/225.7 |
| 5,764,096 | A | 6/1998 | Lipp et al. | 327/434 |
| 5,774,011 | A * | 6/1998 | Au et al. | 327/525 |
| 5,789,796 | A | 8/1998 | Kang et al. | 257/530 |
| 5,811,869 | A * | 9/1998 | Seyyedy et al. | 257/530 |
| 5,834,813 | A | 11/1998 | Ma et al. | 257/368 |
| 5,851,882 | A * | 12/1998 | Harshfield | 438/275 |
| 5,859,562 | A | 1/1999 | McCollum | 327/525 |
| 5,909,049 | A * | 6/1999 | McCollum | 257/530 |
| 5,973,380 | A | 10/1999 | Cutter et al. | 257/530 |
| 5,973,725 | A | 10/1999 | Cutter et al. | 257/530 |
| 5,978,248 | A * | 11/1999 | Marr et al. | 365/96 |
| 6,069,064 | A | 5/2000 | Cutter et al. | 438/600 |
| 6,115,283 | A * | 9/2000 | Hidaka | 365/149 |
| 6,180,994 | B1 * | 1/2001 | Bergemont et al. | 257/530 |
| 6,222,212 | B1 * | 4/2001 | Lee et al. | 257/207 |
| 6,233,194 | B1 * | 5/2001 | Marr et al. | 365/225.7 |
| 6,242,335 | B1 * | 6/2001 | Sher et al. | 438/600 |
| 6,252,293 | B1 * | 6/2001 | Seyyedy et al. | 257/530 |

* cited by examiner

METHOD OF ANTI-FUSE REPAIR

This application is a Continuation of U.S. Pat. Application Ser. No. 09/560,498, filed Apr. 27, 2000 now U.S. Pat. No. 6,233,194 which is a Continuation of U.S. Pat. Application Ser. No. 09/389,072, filed Sep. 2, 1999 ABN which is a Continuation of U.S. Pat. Application Ser. No. 09/030,130, filed on Feb. 25, 1998 now issued as U.S. Pat. No. 5,978,248 on Nov. 2, 1999 which is a Continuation of U.S. Pat. Application Ser. No. 08/700,234, filed Aug. 20, 1996, now issued as U.S. Pat. No. 5,742,555 on Apr. 21, 1998.

TECHNICAL FIELD OF THE INVENTION

The present invention relates generally to integrated circuits and in particular the present invention relates to a circuit and method of anti-fuse repair.

BACKGROUND OF THE INVENTION

Integrated circuits commonly use programmable elements such as fusible links to allow custom programming of the integrated circuits after fabrication. While fusible links can be used for a variety of applications, they can be particularly useful in replacing defective circuits with redundant circuits. For example, integrated circuit memories are often fabricated with redundant memory cells. These memory cells can be selectively enabled after fabrication to replace defective memory cells which are detected during test operations.

One type of fusible link which could be used is a standard polysilicon fuse. The fuse comprises a polysilicon conductor approximately 0.5 $\mu$ thick which is fabricated on the integrated circuit such that in its normal state there is a complete electrical path through the fuse. To program the fuse, a high power laser is used to open the electrical path by evaporating a portion of the polysilicon. While effective, the use of polysilicon fuses is limited by physical size requirements. That is, the fuses must be spaced so that neighboring fuses are not damaged when a fuse is opened using a laser. As integrated circuits continue to be fabricated with high density circuitry, the need for more fusible links also increases. The physical spacing requirements of laser fuses, therefore, prohibits their effective use in these high density circuits. Further, polysilicon laser fuses cannot be programmed once the integrated circuit is packaged, or encapsulated in any manner.

Another type of fusible link which has been used in integrated circuits is an anti-fuse. The anti-fuse is electrically opposite of the fuse in that the anti-fuse is a normally open circuit. To program the anti-fuse, its connections are shorted together to form an electrical path through the anti-fuse. One type of anti-fuse which is commonly used in integrated circuits is an oxide-nitride-oxide (ONO) anti-fuse. A typical ONO anti-fuse has a layer of nitride sandwiched between two layers of oxide, where the bottom layer of oxide is in contact with polysilicon and the top layer of oxide is also in contact with polysilicon. The ONO sandwich is a dielectric such that the unprogrammed anti-fuse functions as a capacitor. To program the ONO anti-fuse, a large potential is applied across the dielectric such that the dielectric is ruptured and the two polysilicon layers are shorted together. Although ONO anti-fuses are currently used in DRAMs where they are part of the normal process flow, this may not be true for future DRAMs. Any extra step, such as constructing a capacitor/dielectric structure for use as an anti-fuse, is time consuming and expensive.

For the reasons stated above, and for other reasons stated below which will become apparent to those skilled in the art upon reading and understanding the present specification, there is a need in the art for both an anti-fuse which does not require nitride and a method of programming the anti-fuse which does not result in damage to surrounding circuitry.

SUMMARY OF THE INVENTION

The above mentioned problems with anti-fuses and other problems are addressed by the present invention and which will be understood by reading and studying the following specification. An anti-fuse is described which is fabricated with a layer of oxide and uses an external connection for programming.

In particular, the present invention describes an anti-fuse fabricated in an integrated circuit device comprising first and second conductive plates, and a layer of oxide fabricated between the first and second conductive plates. Anti-fuse logic circuitry is connected to the first plate for selectively coupling the first plate to a program voltage level. A bias circuit is connected to the second plate for coupling the second plate to a bias voltage level. An external connection is connected to the second plate for coupling the second plate to a pre-determined external voltage level during anti-fuse programming.

In an alternate embodiment, an integrated circuit memory is described which comprises an anti-fuse having a layer of oxide fabricated between a polysilicon layer having a dopant polarity and a well formed in a substrate, the well having the same dopant polarity of the polysilicon layer. Program circuitry is connected to the polysilicon layer for providing a program voltage, and an external connection is coupled to the well for providing an external voltage to the well. A bias circuit is connected to the well for coupling the well to a bias voltage.

In yet another embodiment, a method of programming an integrated circuit anti-fuse is described. The anti-fuse comprises a layer of oxide fabricated between two conductive plates. The plates can be fabricated as a polysilicon layer and a well formed in a silicon substrate. The method comprises the steps of coupling the well to a pre-determined negative potential, providing a pre-determined positive potential using programming logic, coupling the polysilicon layer to the pre-determined positive potential, and creating a current path through the layer of oxide to electrically connect the polysilicon layer to the substrate.

Finally, another method of programming an integrated circuit anti-fuse is described. The anti-fuse comprises a layer of oxide fabricated between a polysilicon layer and a well formed in a silicon substrate. The method comprises the steps of coupling the well to a pre-determined positive potential, providing an pre-determined negative potential using programming logic, coupling the polysilicon layer to the pre-determined negative potential, and creating a current path through the layer of oxide to electrically connect the polysilicon layer to the substrate.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
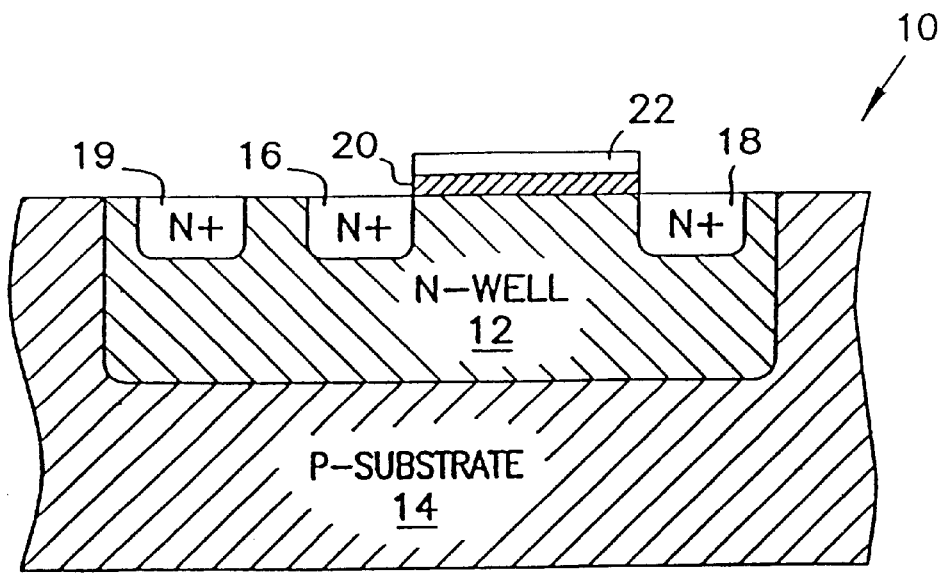
FIG. 1 is a cross section of an anti-fuse of the present invention.
Figure 2:
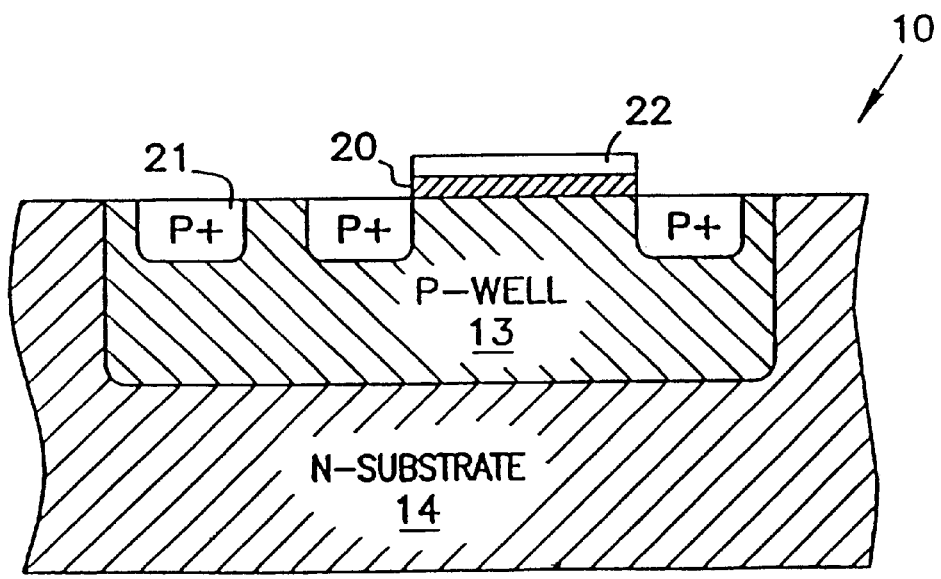
FIG. 2 is a cross section of an alternate anti-fuse of the present invention.

FIG. 1 illustrates one embodiment of an anti-fuse 10 of the present invention. The anti-fuse is fabricated as a gate oxide capacitor using standard transistor fabrication techniques. The capacitor has a layer of n-type polysilicon 22 fabricated on a layer of gate oxide 20, which has been fabricated on an N-well 12 formed in a silicon substrate 14. It will be appreciated that the anti-fuse can also be fabricated as a depletion mode device. The anti-fuse, therefore, has one plate comprising the layer of polysilicon and a second plate comprising the N-well. N+ diffusion regions 16 and 18 (used as source and drain in transistor fabrication) can be used to provide a contact for the second plate of the anti-fuse. Alternatively, an optional well tie diffusion region 19 can be provided as a contact for the second plate. It will be appreciated by those skilled in the art that the anti-fuse can be fabricated as illustrated in FIG. 2 using a p-type polysilicon and a p-well.

Figure 3:
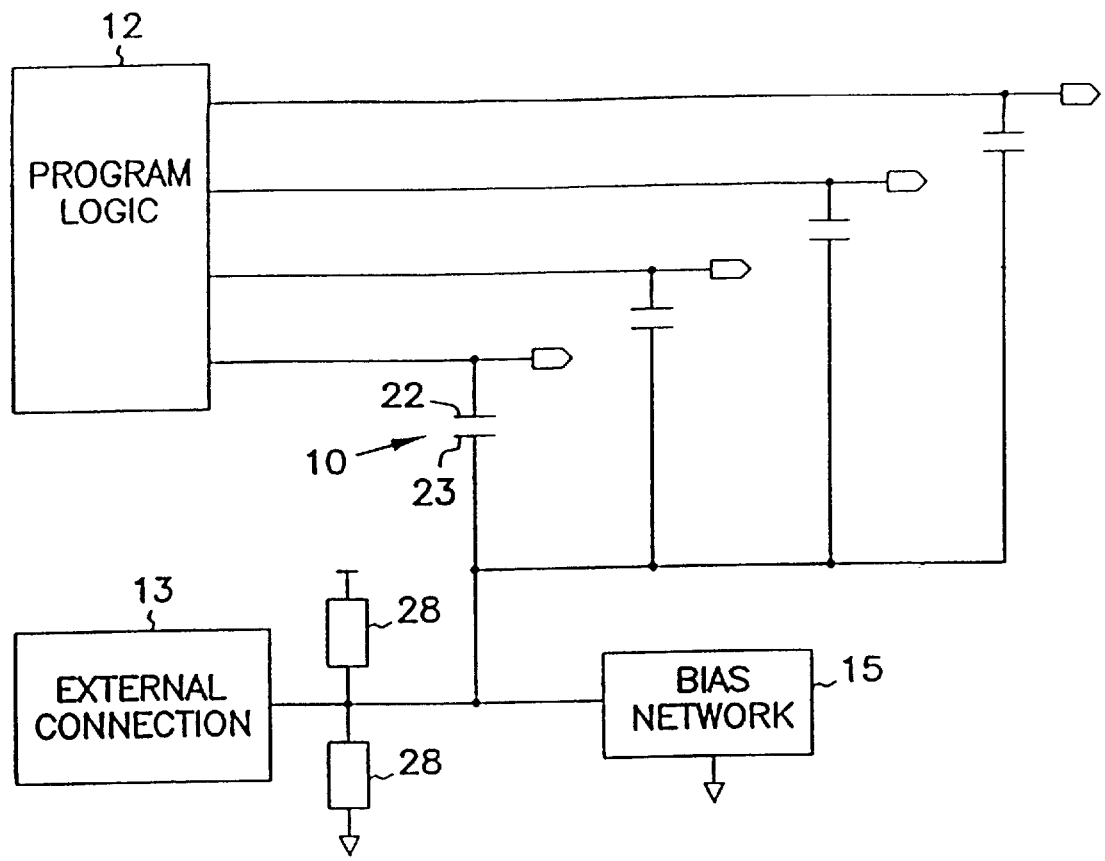
FIG. 3 is a portion of a memory incorporating an anti-fuse of the present invention.
Figures 4A, 4B, 4C:
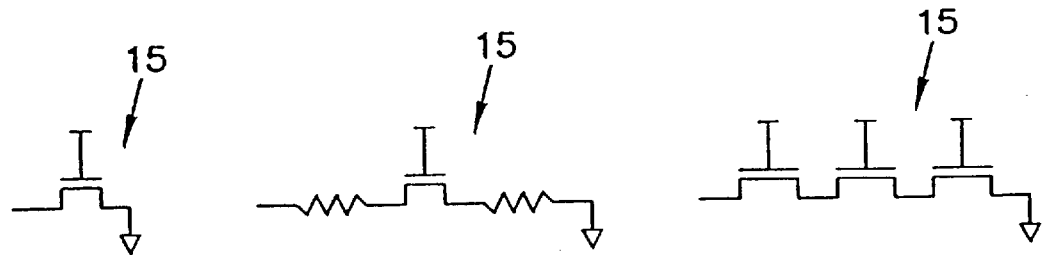
FIG. 4a is a schematic of a bias network of the circuit of FIG. 3.
FIG. 4b is a schematic of a bias network of the circuit of FIG. 3.
FIG. 4c is a schematic of a bias network of the circuit of FIG. 3.

The anti-fuse can be connected, in a preferred way, as illustrated in the 4 element anti-fuse bank of FIG. 3. A first plate 22 of the anti-fuse can be connected to anti-fuse programming logic 12. The other plate 23 of the anti-fuse is connected to an external contact 13, such as an input pin of an integrated circuit package. The external contact can be connected to a bias network 15. FIGS. 4a, 4b and 4c illustrate alternative bias circuits. The circuit of FIG. 4a comprises a long-L transistor having a drain connected to the external contact and its source connected to ground. FIG. 4b illustrates a long-L transistor having its drain connected to the external contact through a resistor and its source connected to ground (zero potential) through a second resistor. An alternate bias network includes series long-L transistors as illustrated in FIG. 4c. It will be appreciated that any type of transistor or bias circuit can be used without departing from the present invention. Optional electro-static discharge (ESD) circuitry 28 can be provided to protect the circuit from unwanted voltages coupled to the external connection.

To program the anti-fuse a voltage must be applied across the plates of the anti-fuse sufficient to create a current path through the gate oxide layer. This voltage is typically greater than the voltage levels experienced by the integrated circuit during normal operations. The difference between the operating voltage and the break-down voltage insures the integrity of the oxide layer during operation of the integrated circuit. For example, a potential difference across anti-fuse plates of approximately 14 volts is required to break down an anti-fuse having a gate oxide dielectric layer 100 Å thick. This potential can be split between plate 22 and the external connection 13, such that the external connection operates as a virtual ground. Therefore, +7 volts can be provided on plate 22 and −7 volts can be provided on connection 13. It will be appreciated that the break-down potential can be provided in any combination. Thus, plate 22 can be coupled to 0 volts and connection 13 can be coupled to +14 volts.

The method described above can be used with any anti-fuse, and is not limited to anti-fuses having a dielectric layer of gate oxide. Thus, any anti-fuse requiring a predetermined potential for programming can be programmed by coupling one plate to a first potential and a second plate to an external connection having a second potential provided thereon. The sum of the first and second potentials equal the predetermined potential.

In a preferred embodiment, an anti-fuse is programmed by biasing the second plate 23 of the anti-fuse to a positive voltage. The anti-fuse is programmed by selectively grounding the first plate 22 of the anti-fuse using the logic circuit 12. All non-programmed anti-fuse devices are held to a predetermined intermediate voltage which is within the safe operating margin of the anti-fuse. Thus, a full bias voltage appears across the anti-fuse which is to be programmed and only a portion of that voltage appears across un-programmed elements. It will be appreciated by those skilled in the art that circuitry coupled to the anti-fuse must be chosen to withstand the current demands needed to rupture the gate oxide layer.

Once an anti-fuse has been programmed, the bias level is removed from the external connection and the electrically connected first and second plates of the anti-fuse are coupled to ground through the bias network 15. The anti-fuse has been described as fabricated in an n-well using an n-type polysilicon layer. The common n-type to n-type configuration is preferred to eliminate the parasitic diode which would occur after programming the anti-fuse. Rupturing the gate oxide would result in a p-n junction if the silicon doping and polysilicon were different. As stated above, a p-type, to p-type anti-fuse can be fabricated using p-type polysilicon.

Figure 5:
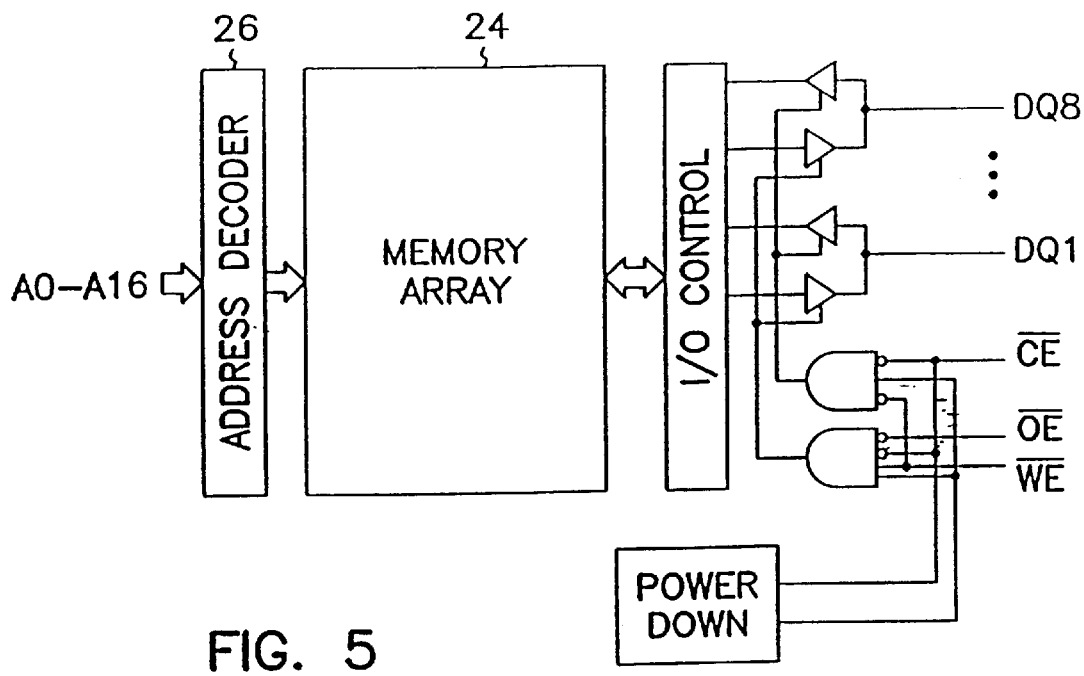
FIG. 5 is a block diagram of a memory incorporating an anti-fuse of the present invention.

The above described anti-fuse can be fabricated in any integrated circuit, including but not limited to memories such as SRAMs and DRAMs, programmable logic devices, PROMs, EPROMs, and EEPROMs. FIG. 5 is a simplified block diagram of a static random access memory device (SRAM) incorporating the present invention. The device is organized as a 128 k×8 SRAM having eight bit data input/output paths labeled DQ1–DQ8 providing data storage for 1,048,576 bits of information in the memory array 24. An address decoder 26 accesses memory cell addresses in response to signals provided on the address inputs (A0–A16). Data is written to the memory when write enable (WE*) and chip enable (CE*) are both low. Data is read from the memory when WE* is high and output enable (OE*) and CE* are both low.

Figure 6:
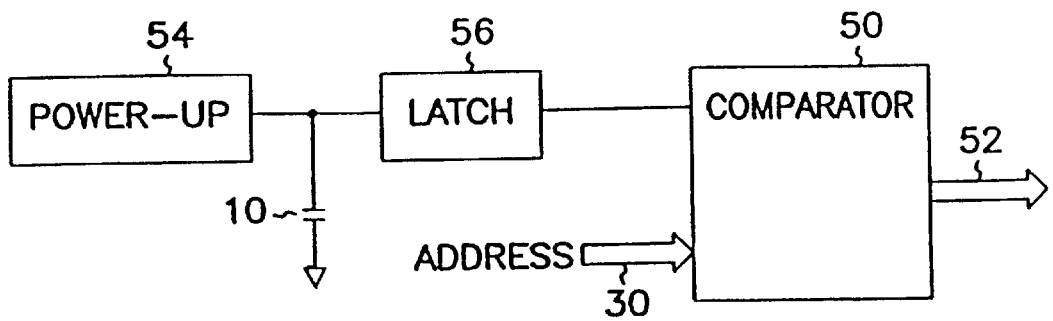
FIG. 6 illustrates a portion of the memory of FIG. 5.

FIG. 6 illustrates a portion of address decoder 26 of FIG. 5 which incorporates anti-fuse 10. The anti-fuses are used to indicate memory cell addresses of memory cells which have been determined to be defective such that redundant memory cells can be used. A compare circuit 50 is provided which compares the external memory addresses 30 to the anti-fuse 10 and produces an appropriate memory cell output address 52. The output address can then be used to access redundant memory cells when appropriate. The anti-fuse is coupled to both a power-up circuit 54 and a latch circuit 56. The power-up circuit is used to read the anti-fuse when the memory is first turned on, and the latch circuit is used to latch the state of the anti-fuse during normal operations. The power-up circuit and latch are merely one method of reading the state of anti-fuse. Other possible methods include the use of a static circuit such as a load device and static logic detection circuitry. It will be appreciated that the anti-fuse 10 can be incorporated into the memory circuit for any desired purpose and is not limited to redundant memory cell circuitry.

Figure 7:
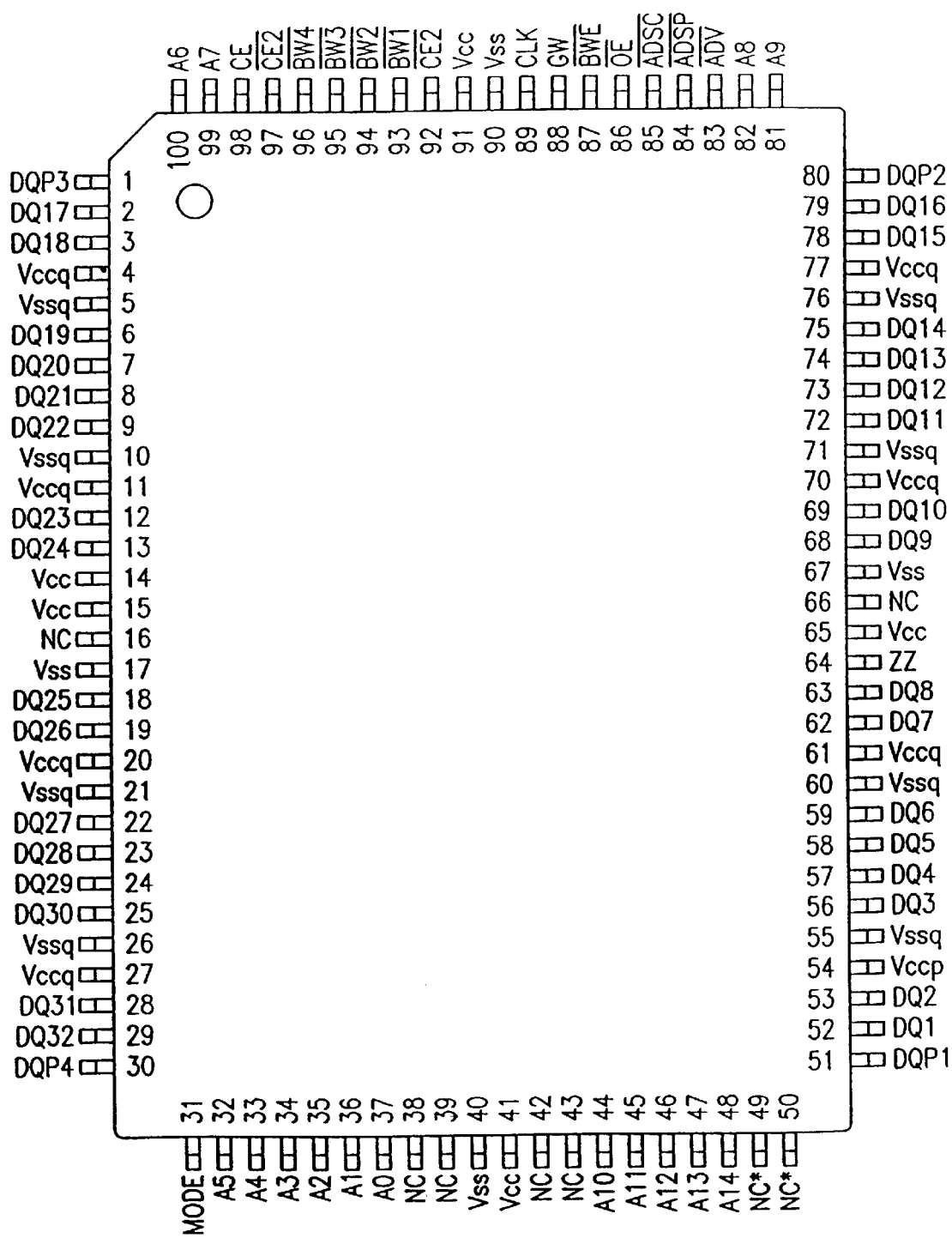
FIG. 7 is an integrated circuit package incorporating the present invention.

FIG. 7 is an integrated circuit package of a 32 k×36 SRAM incorporating the present invention. Pin number 16, 66, 38, 39, 42 or 43 can be used as external connection 13. It will be understood that any size memory can be used and that any non-reserved pin can be used as external connection 13.

CONCLUSION

An integrated circuit anti-fuse has been described which uses a layer of oxide of isolate the plates of the anti-fuse. One of the plates is fabricated as a well formed in the integrated circuit substrate to electrically isolate the plate from surrounding circuitry during programming. The anti-fuse is programmed by coupling one of the plates to an external connection and coupling the other plate to an internal programming logic circuit. A differential voltage is provided across the anti-fuse plates to rupture the layer of oxides and form a conductive path (short) through the oxide. The voltage provided on the external connection is terminated, and the anti-fuse is biased to a pre-determined voltage during normal operation using a bias circuit, such as a pull down transistor.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:

a pin external to the integrated circuit;

a programming circuit; and a plurality of anti-fuses coupled between the pin and the programming circuit, each anti-fuse comprising:
a first plate coupled to the pin to receive a predetermined voltage;
a second plate coupled to the programming circuit to receive a first programming voltage or a second programming voltage that is between the predetermined voltage and the first programming voltage; and
an insulator between the first plate and the second plate that is ruptured when the anti-fuse is programmed by the first programming voltage.

2. The integrated circuit of claim 1 wherein:

the first plate comprises an n-type well in a p-type silicon substrate, the n-type well having an n+-type well tie diffusion region that is coupled to the pin to receive the predetermined voltage;

the insulator comprises a layer of oxide; and the second plate comprises a layer of n-type polysilicon.

3. The integrated circuit of claim 1 wherein:

the first plate comprises a p-type well in an n-type silicon substrate, the p-type well having a p+-type well tie diffusion that is coupled to the pin to receive the predetermined voltage;

the insulator comprises a layer of oxide; and the second plate comprises a layer of p-type polysilicon.

4. The integrated circuit of claim 1 wherein:

the predetermined voltage comprises −7 volts and the first programming voltage comprises +7 volts;

the integrated circuit comprises a memory device and further comprises a memory array, an address decoder including the anti-fuses, and input/output paths;

the programming circuit comprises a programming logic circuit; and further comprising a bias network coupled to the well.

5. An integrated circuit comprising:

a pin external to the integrated circuit;

a programming circuit; and a plurality of anti-fuses coupled between the pin and the programming circuit, each anti-fuse comprising:
a well of a first conductivity type in a substrate of a second conductivity type, the well being coupled to the pin to receive a predetermined voltage;
a plate coupled to the programming circuit to receive a first programming voltage or a second programming voltage that is between the predetermined voltage and the first programming voltage; and
an insulator between the well and the plate that is ruptured when the anti-fuse is programmed by the first programming voltage.

6. The integrated circuit of claim 5 wherein:

the substrate comprises a p-type silicon substrate;

the well comprises an n-type well in the substrate;

the insulator comprises a layer of oxide;

the plate comprises a layer of n-type polysilicon; and further comprising an n+-type well tie diffusion region in the n-type well that is coupled to the pin to receive the predetermined voltage.

7. The integrated circuit of claim 5 wherein:

the substrate comprises an n-type silicon substrate;

the well comprises a p-type well in the substrate;

the insulator comprises a layer of oxide;

the plate comprises a layer of p-type polysilicon; and further comprising a p+-type well tie diffusion region in the p-type well that is coupled to the pin to receive the predetermined voltage.

8. The integrated circuit of claim 5 wherein:

the predetermined voltage comprises −7 volts and the first programming voltage comprises +7 volts;

the integrated circuit comprises a memory device and further comprises a memory array, an address decoder including the anti-fuses, and input/output paths;

the programming circuit comprises a programming logic circuit; and further comprising a bias network coupled to the well.

9. An integrated circuit comprising:

a pin external to the integrated circuit;

a programming circuit; and a plurality of anti-fuses coupled between the pin and the programming circuit, each anti-fuse comprising:
a plate coupled to the pin to receive a predetermined voltage;

a well of a first conductivity type in a substrate of a second conductivity type, the well being coupled to the programming circuit to receive a first programming voltage or a second programming voltage that is between the predetermined voltage and the first programming voltage; and an insulator between the well and the plate that is ruptured when the anti-fuse is programmed by the first programming voltage.

10. The integrated circuit of claim 9 wherein:
the substrate comprises a p-type silicon substrate;
the well comprises an n-type well in the substrate;
the insulator comprises a layer of oxide;
the plate comprises a layer of n-type polysilicon; and
further comprising an n+-type well tie diffusion region in the n-type well that is coupled to the programming circuit.

11. The integrated circuit of claim 9 wherein:
the substrate comprises an n-type silicon substrate;
the well comprises a p-type well in the substrate;
the insulator comprises a layer of oxide;
the plate comprises a layer of p-type polysilicon; and
further comprising a p+-type well tie diffusion region in the p-type well that is coupled to the programming circuit.

12. The integrated circuit of claim 9, wherein:
the predetermined voltage comprises −7 volts and the first programming voltage comprises +7 volts;
the integrated circuit comprises a memory device and further comprises a memory array, an address decoder including the anti-fuses, and input/output paths;
the programming circuit comprises a programming logic circuit; and
further comprising a bias network coupled to the plate.

13. An integrated circuit comprising:
a pin external to the integrated circuit;
a programming circuit; and
a plurality of anti-fuses coupled between the pin and the programming circuit, each anti-fuse comprising:
an n-type well in a p-type silicon substrate, the n-type well being coupled to the pin to receive a predetermined voltage;
a layer of n-type polysilicon coupled to the programming circuit to receive a first programming voltage or a second programming voltage that is between the predetermined voltage and the first programming voltage; and
an insulator between the n-type well and the layer of n-type polysilicon that is ruptured when the anti-fuse is programmed by the first programming voltage.

14. The integrated circuit of claim 13 wherein:
the insulator comprises a layer of oxide;
the predetermined voltage comprises −7 volts and the first programming voltage comprises +7 volts;
the integrated circuit comprises a memory device and further comprises a memory array, an address decoder including the anti-fuses, and input/output paths;
the programming circuit comprises a programming logic circuit; and
further comprising:
a bias network coupled to the n-type well; and
an n+-type well tie diffusion region in the n-type well that is coupled to the pin to receive the predetermined voltage.

15. An integrated circuit comprising:
a pin external to the integrated circuit;
a programming circuit; and
a plurality of anti-fuses coupled between the pin and the programming circuit, each anti-fuse comprising:
a p-type well in an n-type silicon substrate, the p-type well being coupled to the pin to receive a predetermined voltage;
a layer of p-type polysilicon coupled to the programming circuit to receive a first programming voltage or a second programming voltage that is between the predetermined voltage and the first programming voltage; and
an insulator between the p-type well and the layer of p-type polysilicon that is ruptured when the anti-fuse is programmed by the first programming voltage.

16. The integrated circuit of claim 15 wherein:
the insulator comprises a layer of oxide;
the predetermined voltage comprises −7 volts and the first programming voltage comprises +7 volts;
the integrated circuit comprises a memory device and further comprises a memory array, an address decoder including the anti-fuses, and input/output paths;
the programming circuit comprises a programming logic circuit; and
further comprising:
a bias network coupled to the p-type well; and
a p+-type well tie diffusion region in the p-type well that is coupled to the pin to receive the predetermined voltage.

17. A method comprising:
selecting a first group of anti-fuses in an integrated circuit to be programmed and a second group of anti-fuses in the integrated circuit that are not to be programmed, each anti-fuse in the first group and the second group comprising:
a first plate coupled to a pin external to the integrated circuit;
a second plate coupled to a programming circuit; and
an insulator between the first plate and the second plate;
coupling a predetermined voltage to the pin of the integrated circuit;
coupling a first programming voltage from the programming circuit to the second plate of each anti-fuse in the first group to rupture the insulator of each anti-fuse in the first group;
coupling a second programming voltage from the programming circuit to the second plate of each anti-fuse in the second group, the second programming voltage being between the predetermined voltage and the first programming voltage.

18. The method of claim 17 wherein:
coupling a predetermined voltage further comprises coupling the predetermined voltage to an n+-type well tie diffusion region in an n-type well in a p-type silicon substrate of each anti-fuse, each n+-type well tie diffusion region being coupled to the pin;
coupling a first programming voltage further comprises coupling the first programming voltage from the programming circuit to a layer of n-type polysilicon comprising the second plate of each anti-fuse in the first group to rupture a layer of oxide comprising the insulator of each anti-fuse in the first group; and
coupling a second programming voltage further comprises coupling the second programming voltage from the programming circuit to a layer of n-type polysilicon comprising the second plate of each anti-fuse in the second group to avoid rupture of a layer of oxide comprising the insulator of each anti-fuse in the second group.

19. The method of claim 17 wherein:

coupling a predetermined voltage further comprises coupling the predetermined voltage to a p+-type well tie diffusion region in a p-type well in an n-type silicon substrate of each anti-fuse, each p+-type well tie diffusion region being coupled to the pin;

coupling a first programming voltage further comprises coupling the first programming voltage from the programming circuit to a layer of p-type polysilicon comprising the second plate of each anti-fuse in the first group to rupture a layer of oxide comprising the insulator of each anti-fuse in the first group; and coupling a second programming voltage further comprises coupling the second programming voltage from the programming circuit to a layer of p-type polysilicon comprising the second plate of each anti-fuse in the second group to avoid rupture of a layer of oxide comprising the insulator of each anti-fuse in the second group.

20. The method claim 17 wherein:

coupling a predetermined voltage further comprises coupling −7 volts to the pin of the integrated circuit;

coupling a first programming voltage further comprises coupling +7 volts from a programming logic circuit comprising the programming circuit to the second plate of each anti-fuse in the first group; and further comprising accessing a memory cell in a memory array of a memory device comprising the integrated circuit with an address coupled to an address decoder including the anti-fuses, and coupling a bit through input/output paths to the accessed memory cell to read or store the bit.

21. A method comprising:

selecting a first group of anti-fuses in an integrated circuit to be programmed and a second group of anti-fuses in the integrated circuit that are not to be programmed, each anti-fuse in the first group and the second group comprising:

a well of a first conductivity type in a substrate of a second conductivity type, the well being coupled to a pin external to the integrated circuit;

a plate coupled to a programming circuit; and an insulator between the well and the plate;

coupling a predetermined voltage to the pin of the integrated circuit;

coupling a first programming voltage from the programming circuit to the plate of each anti-fuse in the first group to rupture the insulator of each anti-fuse in the first group;

coupling a second programming voltage from the programming circuit to the plate of each anti-fuse in the second group, the second programming voltage being between the predetermined voltage and the first programming voltage.

22. The method of claim 21 wherein:

coupling a predetermined voltage further comprises coupling the predetermined voltage to an n+-type well tie diffusion region in an n-type well in a p-type silicon substrate of each anti-fuse, each n+-type well tie diffusion region being coupled to the pin;

coupling a first programming voltage further comprises coupling the first programming voltage from the programming circuit to a layer of n-type polysilicon comprising the plate of each anti-fuse in the first group to rupture a layer of oxide comprising the insulator of each anti-fuse in the first group; and coupling a second programming voltage further comprises coupling the second programming voltage from the programming circuit to a layer of n-type polysilicon comprising the plate of each anti-fuse in the second group to avoid rupture of a layer of oxide comprising the insulator of each anti-fuse in the second group.

23. The method of claim 21 wherein:

coupling a predetermined voltage further comprises coupling the predetermined voltage to a p+-type well tie diffusion region in a p-type well in an n-type silicon substrate of each anti-fuse, each p+-type well tie diffusion region being coupled to the pin;

coupling a first programming voltage further comprises coupling the first programming voltage from the programming circuit to a layer of p-type polysilicon comprising the plate of each anti-fuse in the first group to rupture a layer of oxide comprising the insulator of each anti-fuse in the first group; and coupling a second programming voltage further comprises coupling the second programming voltage from the programming circuit to a layer of p-type polysilicon comprising the plate of each anti-fuse in the second group to avoid rupture of a layer of oxide comprising the insulator of each anti-fuse in the second group.

24. The method claim 21 wherein:

coupling a predetermined voltage further comprising coupling −7 volts to the pin of the integrated circuit;

coupling a first programming voltage further comprises coupling +7 volts from a programming logic circuit comprising the programming circuit to the plate of each anti-fuse in the first group; and further comprising accessing a memory cell in a memory array of a memory device comprising the integrated circuit with an address coupled to an address decoder including the anti-fuses, and coupling a bit through input/output paths to the accessed memory cell to read or store the bit.

25. A method comprising:

selecting a first group of anti-fuses in an integrated circuit to be programmed and a second group of anti-fuses in the integrated circuit that are not to be programmed, each anti-fuse in the first group and the second group comprising:

a plate coupled to a pin external to the integrated circuit;

a well of a first conductivity type in a substrate of a second conductivity type, the well being coupled to a programming circuit; and an insulator between the well and the plate;

coupling a predetermined voltage to the pin of the integrated circuit;

coupling a first programming voltage from the programming circuit to the well of each anti-fuse in the first group to rupture the insulator of each anti-fuse in the first group;

coupling a second programming voltage from the programming circuit to the well of each anti-fuse in the second group, the second programming voltage being between the predetermined voltage and the first programming voltage.

26. The method of claim 25 wherein:

coupling a predetermined voltage further comprises coupling the predetermined voltage to a layer of n-type polysilicon comprising the plate of each anti-fuse, each layer of n-type polysilicon being coupled to the pin;

coupling a first programming voltage further comprises coupling the first programming voltage from the programming circuit to an n+-type well tie diffusion regon in an n-type well in a p-type silicon substrate of each anti-fuse in the first group to rupture a layer of oxide comprising the insulator of each anti-fuse in the first group; and coupling a second programming voltage further comprises coupling the second programming voltage from the programming circuit to an n+-type well tie diffusion region in an n-type well in a p-type silicon substrate of each anti-fuse in the second group to avoid rupture of a layer of oxide comprising the insulator of each anti-fuse in the second group.

27. The method of claim 25 wherein:

coupling a predetermined voltage further comprises coupling the predetermined voltage to a layer of p-type polysilicon comprising the plate of each anti-fuse, each layer of p-type polysilicon being coupled to the pin;

coupling a first programming voltage further comprises coupling the first programming voltage from the programming circuit to a p+-type well tie diffusion region in a p-type well in an n-type silicon substrate of each anti-fuse in the first group to rupture a layer of oxide comprising the insulator of each anti-fuse in the first group; and coupling a second programming voltage further comprises coupling the second programming voltage from the programming circuit to a p+-type well tie diffusion region in a p-type well in an n-type silicon substrate of each anti-fuse in the second group to avoid rupture of a layer of oxide comprising the insulator of each anti-fuse in the second group.

28. The method claim 25 wherein:

coupling a predetermined voltage further comprises coupling −7 volts to the pin of the integrated circuit;

coupling a first programming voltage further comprising coupling +7 volts from a programming logic circuit comprising the programming circuit to the well of each anti-fuse in the first group; and further comprising accessing a memory cell in a memory array of a memory device comprising the integrated circuit with an address coupled to an address decoder including the anti-fuses, and coupling a bit through input/output paths to the accessed memory cell to read or store the bit.

29. A method comprising:

selecting a first group of anti-fuses in an integrated circuit to be programmed and a second group of anti-fuses in the integrated circuit that are not to be programmed, each anti-fuse in the first group and the second group comprising:
  an n-type well in a p-type silicon substrate, the n-type well being coupled to a pin external to the integrated circuit;
  a layer of n-type polysilicon coupled to a programming circuit; and
  an insulator between the n-type well and the layer of n-type polysilicon;

coupling a predetermined voltage to the pin of the integrated circuit;

coupling a first programming voltage from the programming circuit to the layer of n-type polysilicon of each anti-fuse in the first group to rupture the insulator of each anti-fuse in the first group; and coupling a second programming voltage from the programming circuit to the layer of n-type polysilicon of each anti-fuse in the second group, the second programming voltage being between the predetermined voltage and the first programming voltage.

30. The method claim 29 wherein:

coupling a predetermined voltage further comprises coupling −7 volts to the pin of the integrated circuit that is coupled to an n+-type well tie diffusion region in the n-type well of each anti-fuse;

coupling a first programming voltage further comprises coupling +7 volts from a programming logic circuit comprising the programming circuit to the layer of n-type polysilicon of each anti-fuse in the first group to rupture a layer of oxide comprising the insulator of each anti-fuse in the first group; and further comprising accessing a memory cell in a memory array of a memory device comprising the integrated circuit with an address coupled to an address decoder including the anti-fuses, and coupling a bit through input/output paths to the accessed memory cell to read or store the bit.

31. A method comprising:

selecting a first group of anti-fuses in an integrated circuit to be programmed and a second group of anti-fuses in the integrated circuit that are not to be programmed, each anti-fuse in the first group and the second group comprising:
  a p-type well in an n-type silicon substrate, the p-type well being coupled to a pin external to the integrated circuit;
  a layer of p-type polysilicon coupled to a programming circuit; and
  an insulator between the p-type well and the layer of p-type polysilicon;

coupling a predetermined voltage to the pin of the integrated circuit;

coupling a first programming voltage from the programming circuit to the layer of p-type polysilicon of each anti-fuse in the first group to rupture the insulator of each anti-fuse in the first group; and coupling a second programming voltage from the programming circuit to the layer of p-type polysilicon of each anti-fuse in the second group, the second programming voltage being between the predetermined voltage and the first programming voltage.

32. The method of claim 31 wherein:

coupling a predetermined voltage further comprises coupling −7 volts to the pin of the integrated circuit that is coupled to a p+-type well tie diffusion region in the p-type well of each anti-fuse;

coupling a first programming voltage further comprises coupling +7 volts from a programming logic circuit comprising the programming circuit to the layer of p-type polysilicon of each anti-fuse in the first group to rupture a layer of oxide comprising the insulator of each anti-fuse in the first group; and further comprising accessing a memory cell in a memory array of a memory device comprising the integrated circuit with an address coupled to an address decoder including the anti-fuses, and coupling a bit through input/output paths to the accessed memory cell to read or store the bit.

* * * * *

UNITED STATES PATENT AND TRADEMARK OFFICE
CERTIFICATE OF CORRECTION

PATENT NO. : 6,515,931 B2
DATED : February 4, 2003
INVENTOR(S) : Kenneth W. Marr and Shubneesh Batra It is certified that error appears in the above-identified patent and that said Letters Patent is hereby corrected as shown below:

Column 5,
Line 6, insert -- the -- before "anti-fuse".
Line 22, delete "of" before "isolate" and insert -- to -- therefor.
Line 30, delete "oxides" and insert -- oxide -- therefor.

Column 6,
Line 4, insert -- region -- after "diffusion".

Column 11,
Line 3, delete "regon" and insert -- region -- therefor.
Line 36, delete "comprising" and insert -- comprises -- therefor.

Signed and Sealed this

Nineteenth Day of August, 2003

JAMES E. ROGAN
*Director of the United States Patent and Trademark Office*